(12) United States Patent
Kumar et al.

(10) Patent No.: US 10,748,844 B2
(45) Date of Patent: Aug. 18, 2020

(54) STRESS ISOLATION FOR SILICON PHOTONIC APPLICATIONS

(71) Applicant: Intel Corporation, Santa Clara, CA (US)

(72) Inventors: Siddarth Kumar, Chandler, AZ (US); Shawna M. Liff, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 27 days.

(21) Appl. No.: 15/859,331

(22) Filed: Dec. 30, 2017

(65) Prior Publication Data

US 2019/0206782 A1 Jul. 4, 2019

(51) Int. Cl.
| | |
|---|---|
| H01L 23/498 | (2006.01) |
| H01L 21/48 | (2006.01) |
| H01L 23/00 | (2006.01) |
| G02B 6/122 | (2006.01) |
| G02B 6/12 | (2006.01) |
| G02B 6/42 | (2006.01) |

(52) U.S. Cl.
CPC .... *H01L 23/49838* (2013.01); *H01L 21/4803* (2013.01); *H01L 24/16* (2013.01); *G02B 6/122* (2013.01); *G02B 6/12004* (2013.01); *G02B 6/4245* (2013.01); *H01L 24/29* (2013.01); *H01L 24/32* (2013.01); *H01L 2224/16225* (2013.01); *H01L 2224/16227* (2013.01); *H01L 2224/2919* (2013.01); *H01L 2224/32225* (2013.01); *H01L 2224/73204* (2013.01); *H01L 2924/1015* (2013.01); *H01L 2924/1515* (2013.01); *H01L 2924/15159* (2013.01); *H01L 2924/3511* (2013.01)

(58) Field of Classification Search
None
See application file for complete search history.

(56) References Cited

U.S. PATENT DOCUMENTS

| | | | |
|---|---|---|---|
| 2011/0044369 A1* | 2/2011 | Andry | G02B 6/4204 372/50.124 |
| 2013/0032864 A1* | 2/2013 | Javorka | H01L 29/6653 257/288 |
| 2016/0079093 A1* | 3/2016 | Tosaya | H01L 25/0657 257/774 |
| 2016/0178861 A1* | 6/2016 | Osenbach | G02B 6/4251 385/14 |
| 2016/0216445 A1* | 7/2016 | Thacker | G02B 6/12004 |
| 2018/0156973 A1* | 6/2018 | Welch | G02B 6/12004 |
| 2018/0212080 A1* | 7/2018 | Meyer | G01N 21/552 |

* cited by examiner

*Primary Examiner* — Mounir S Amer
(74) *Attorney, Agent, or Firm* — Schwabe, Williamson & Wyatt, P.C.

(57) ABSTRACT

Techniques of minimizing or eliminating stresses in silicon photonic integrated circuits (Si-PICs) and in semiconductor packages having one or more Si-PICs (Si-PIC packages) are described. An Si-PIC or an Si-PIC package includes a stress minimization solution that assists with filtering out stresses by selectively isolating photonic and/or electronic devices, by isolating components or devices in an Si-PIC or an Si-PIC package that are sources of stress, or by isolating an Si-PIC in an Si-PIC package. The stress minimization solution may include strategically placed cavities and a stage that assist with minimizing or preventing transfer of stress to one or more photonic and/or electronic devices in an Si-PIC or an Si-PIC package.

18 Claims, 8 Drawing Sheets

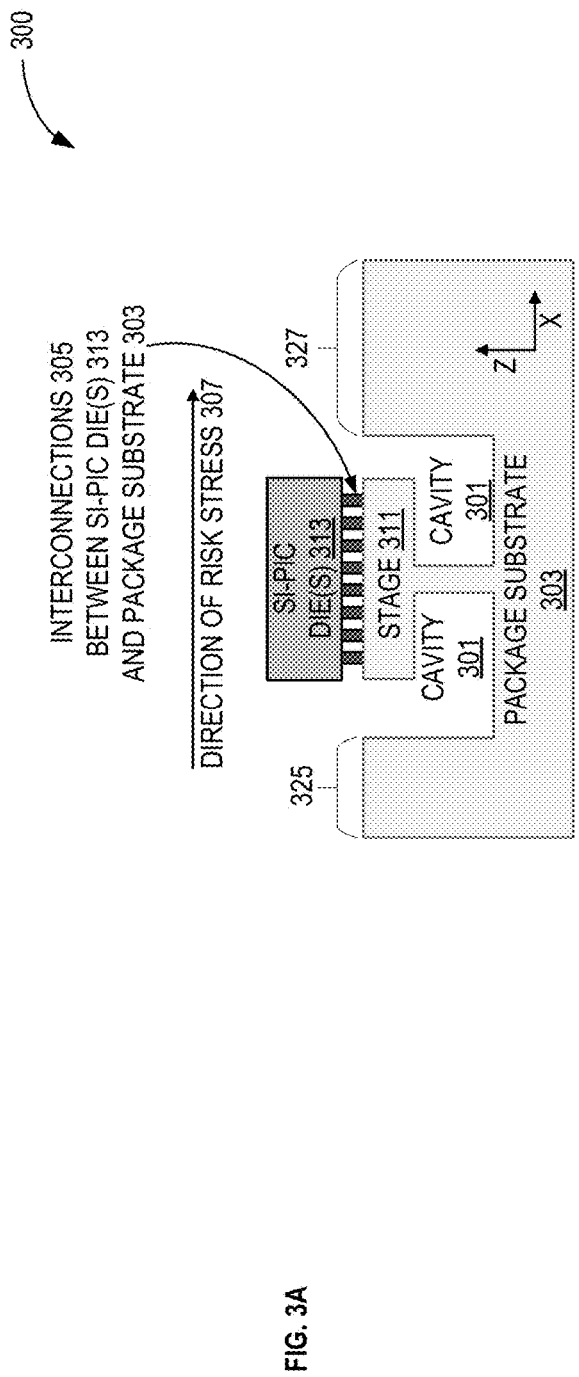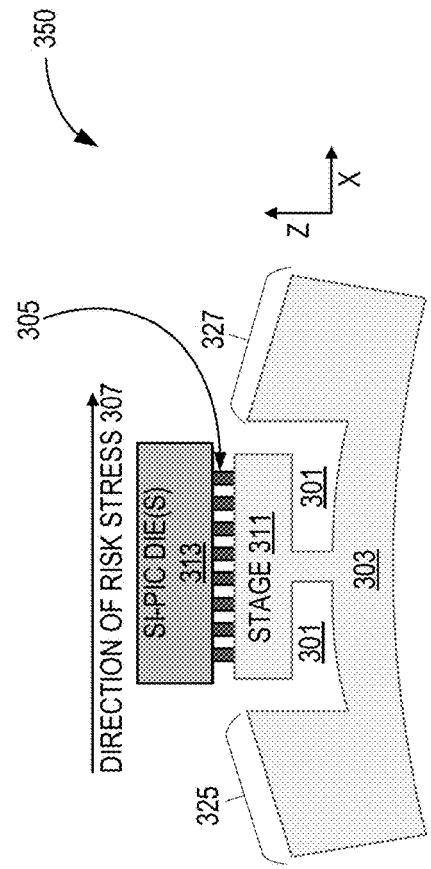
FIG. 3A
FIG. 3B

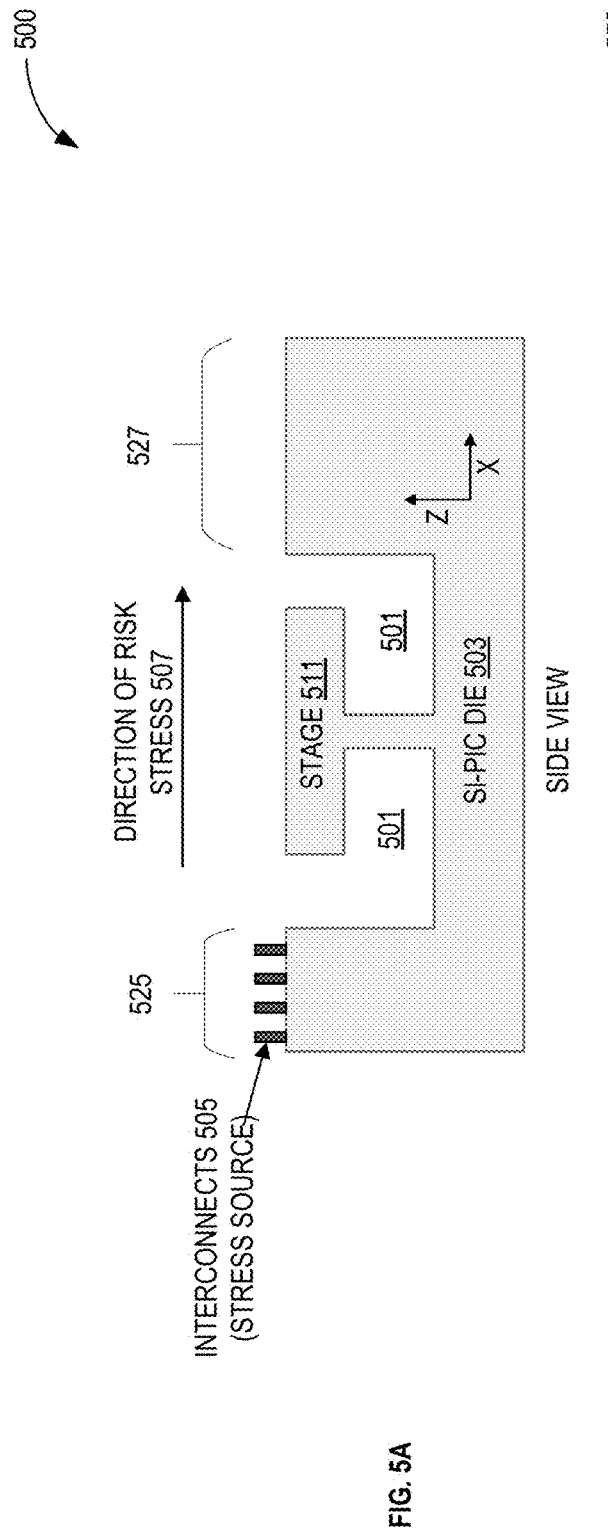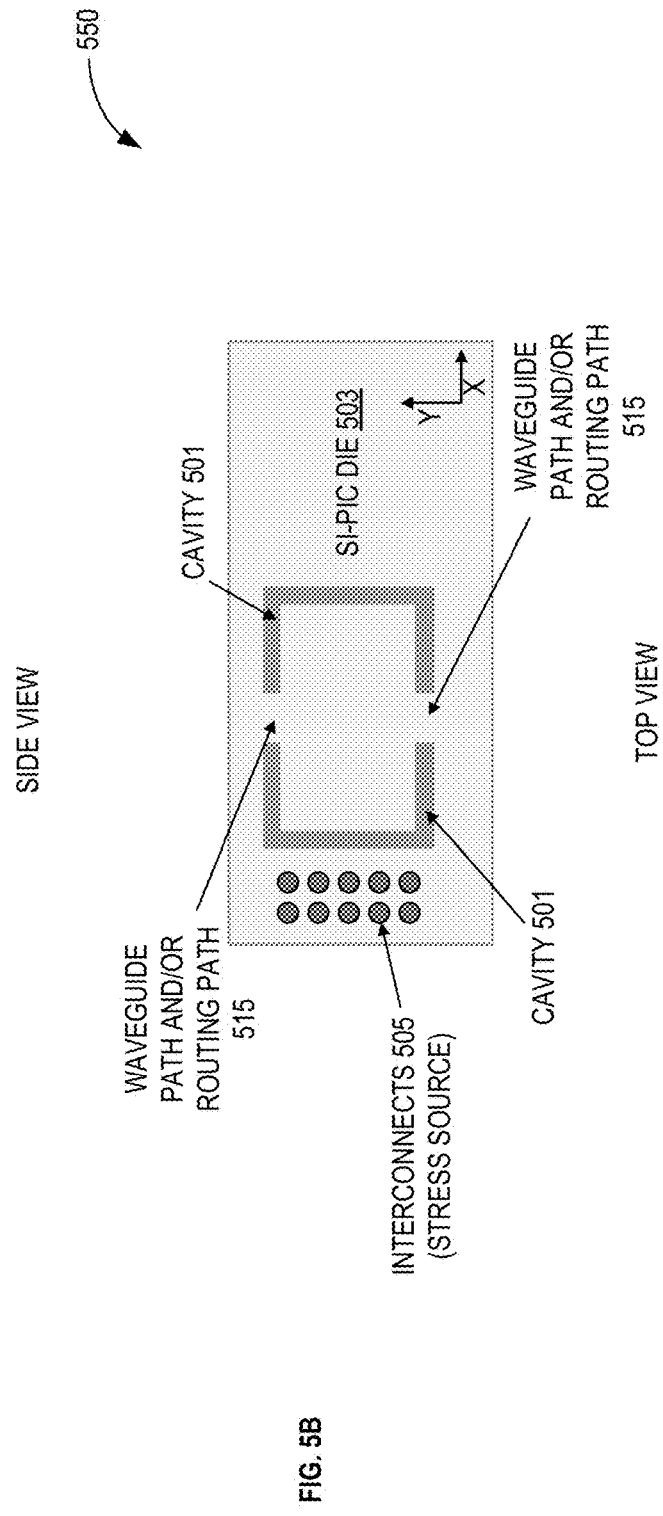
FIG. 5A
FIG. 5B

STRESS ISOLATION FOR SILICON PHOTONIC APPLICATIONS

FIELD

Embodiments generally relate to silicon photonic integrated circuits (Si-PICs) and semiconductor packages that include one or more Si-PICs (Si-PIC packages). More specifically, embodiments relate to techniques of minimizing or eliminating stresses in Si-PIC and Si-PIC packages.

BACKGROUND INFORMATION

Electronic systems that include one or more Si-PICs can exhibit relatively higher bandwidth data transmission rates over longer distances with relatively fewer copper interconnections than is possible with electronic devices that include electronic integrated circuits (electronic IC dies). This is because the data is converted from an electrical signal to an optical one and then transmitted through waveguides and fibers.

An Si-PIC is an example of a semiconductor die that may be used in an electronic system, such as a switch or server. Si-PICs are capable of transmitting and receiving optical signals (e.g., pulses of light, etc.), which can be used to communicate data (e.g., large bundles of data, etc.). Generally, an Si-PIC is formed using silicon on insulator (SOI) technology. SOI technology requires use of a layered silicon-insulator-silicon substrate. More specifically, this layered substrate includes a first layer formed from silicon (Si), a second layer formed from an insulator material that is disposed on the first layer, and a third layer formed from Si that is disposed on the second layer. The silicon in the first and third layers may have different qualities or properties from each other. The second layer can be a buried oxide layer. The insulator material may be formed from silica (i.e., silicon dioxide) and/or any other suitable insulator. Generally, the third layer is known as an active layer that transports optical signals. This active layer is also where one or more photonic devices are patterned lithographically, epitaxially grown, and/or bonded or formed via other similar fabrication techniques.

As used herein, a photonic device includes any optical structure fabricated in or on an active layer of an Si-PIC that guides, generates, manipulates, or detects optical signals (e.g., pulses of light, etc.). Examples of photonic devices include one or more of the following: (i) a laser light source or amplifier formed from group III-V compound semiconductors (e.g., gallium arsenide (GaAs), aluminium gallium arsenide (AlGaAs), indium phosphide (InP), etc.); (ii) an optical modulator (e.g., a Mach-Zehnder interferometer (MZI), electro-absorption modulator (EAM) etc.); (iii) a micro-optical system (e.g., lenses, arrays of lenses, etc.); (iv) a photodetector; (v) an optical switch; and (vi) one or more silicon waveguides used to transport the optical signals to and from the other photonic devices.

Semiconductor packaging of Si-PICs, as used herein, refers to a range of techniques and technical competencies used to make optical, electrical, thermal, mechanical, and/or chemical connections between an Si-PIC and the outside world. An example of such an Si-PIC package that includes one or more of the following: (i) one or more Si-PICs; (ii) one or more electronic IC dies; (iii) a package substrate (e.g., a carrier substrate formed from silicon or other materials, organic build up materials, mold, etc.); (iv) interconnect structures (e.g., wire bonds, bumps, microbumps, pillars, etc.) for coupling the die(s) to the package substrate, another component in the package, or to another package; and (v) one or more thermal cooling components (e.g., at least one heat spreader, at least one heat sink, etc.).

One problem that can affect an Si-PIC package is unwanted stress that is introduced into the package by one or more processes used to the form the package. The stress may damage one or more photonic and/or electronic devices in the Si-PIC package. This damage can cause the photonic and/or electronic device(s) to malfunction, result in destruction of the photonic device(s), or cause degradation of the photonic performance or targeted wavelength and/or decay the lifetimes. For example, an Si-PIC package may include: (i) a laser light source soldered onto a heat spreader; and (ii) the heat spreader soldered onto a heat sink. This soldering process mechanically couples the laser to substrates with different coefficients of thermal expansion, which may introduce mechanical stress into the package that stresses or strains the laser light source as the laser operates and generates heat. The stress or strain applied to the laser may result in damaging the laser light source or shifting the wavelength of operation. Local stresses may negatively affect one or more photonic devices of an Si-PIC package causing changes in refractive indices of the one or more photonic devices. Such changes can result from temperature and/or pressure variations and each may affect the photonic device(s) performance.

BRIEF DESCRIPTION OF THE DRAWINGS

Embodiments described herein are illustrated by way of example and not limitation in the figures of the accompanying drawings, in which like references indicate similar features. Furthermore, in the figures, some details have been omitted so as not to obscure or convolute the inventive concepts described herein.

FIGS. 3A-3B illustrate cross-sectional side view illustrations of an Si-PIC package that includes a stress minimization solution, according to one embodiment.

FIGS. 5A-5B illustrate cross-sectional side view and top view illustrations of an Si-PIC that includes a stress minimization solution, according to another embodiment.

DETAILED DESCRIPTION

Figure 1:
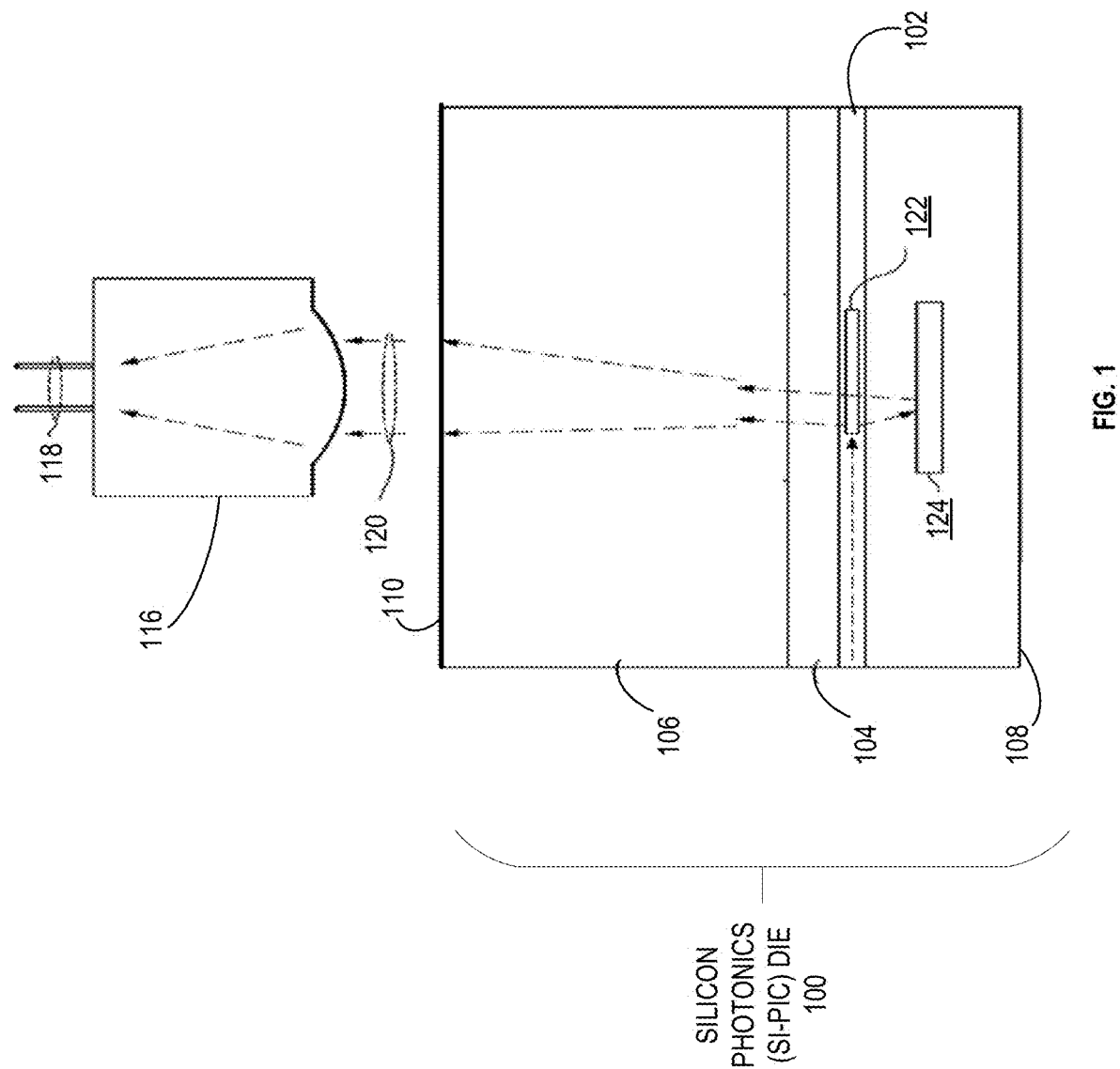
FIG. 1 is a cross-sectional view illustration of an exemplary Si-PIC coupled to an optical fiber with a lens, according to an embodiment.

Embodiments described herein provide techniques of minimizing or eliminating stresses in Si-PICs or Si-PIC packages. For one embodiment, an Si-PIC or an Si-PIC package includes a stress minimization solution that assists with filtering out stresses by selectively isolating photonic and/or electronic devices. Examples of photonic devices include, but are not limited to, laser sources, laser amplifiers, optical modulators, and waveguides and photodetectors (e.g., as shown in FIG. 1, etc.). For one embodiment, an Si-PIC package includes a stress minimization solution that assists with isolating components in the Si-PIC package that are sources of stress. Examples of electronic devices include, but are not limited to, one or more of the following: (i) an electronic IC die, such as, a driver, clock data recovery re-timing chip, transimpedence amplifier, etc.; and (ii) an electronic IC package comprising at least one electronic IC die. For one embodiment, an Si-PIC package includes a stress minimization solution that assists with isolating components in the Si-PIC package that are sources of stress. Examples of components in the Si-PIC package that are sources of stress include, but are not limited to, one or more of the following: (i) one or more Si-PICs; (ii) one or more electronic IC dies; (iii) a package substrate; (iv) interconnect structures (e.g., wire bonds, bumps, microbumps, pillars, etc.) for coupling the die(s) to the package substrate, another component in the package, or to another package; and (v) one or more thermal cooling components (e.g., at least one heat spreader, at least one heat sink, etc.). The mismatch in coefficient of thermal expansion of these components and the encapsulation used to protect their electrical interconnects as well as their layout and differing thermal dissipative power can create stress variations across the package. For one embodiment, an Si-PIC package includes a stress minimization solution that assists with filtering out stresses by selectively isolating the Si-PIC itself from one or more components of the Si-PIC package. For one embodiment, an Si-PIC includes a stress minimization solution that assists with filtering out stresses by selectively isolating one or more photonic devices and/or electronic devices from one or more components or devices of the Si-PIC.

For one embodiment, a stress minimization solution includes strategically placed cavities and stages that minimize or prevent transfer of stress to one or more photonic and/or electronic devices in an Si-PIC or an Si-PIC package. The cavities can reside in one or more of a package substrate and an Si-PIC. The cavities can also be located away from one or more interconnect structures used to couple a photonic device and/or the Si-PIC itself to other components of the package (e.g., a package substrate, a heat spreader, a heat sink, etc.). In a specific embodiment, a stress minimization solution includes at least one cavity placed orthogonally to a direction of risk stress of one or more photonic devices. In an embodiment, at least one of the cavities is formed by removing material from a Si-PIC package or a Si-PIC orthogonally to a direction of risk stress associated with the Si-PIC package or the Si-PIC. The direction of risk stress can be designed to be orthogonal to an optically sensitive structure, pending the system need, e.g., a direction of laser grating associated with the Si-PIC or the Si-PIC package.

Numerous advantages result from embodiments of the techniques described herein. Examples of these currently available techniques include, but are not limited to, minimizing or eliminating damage resulting from stress to one or more dies, one or more photonic and/or electronic devices, and one or more components in an Si-PIC package. This can assist with increasing the lifetime of Si-PICs and Si-PIC packages and with improving the performance and longevity of the die(s), the photonic and/or electronic device(s), and the component(s) in Si-PICs and/or Si-PIC packages without having to use expensive discrete external laser solutions. Furthermore, embodiments of the stress minimization solutions described herein can assist with increasing the reliability of the package and minimizing risk from package design induced residual stress on Si-PIC that can lead to degradation in performance of the Si-PIC or a device that includes the die. Embodiments of the stress minimization solutions described herein can also assist with minimizing risk from assembly/test process interaction induced stress transfer to the Si-PIC that can lead to degradation in performance of the Si-PIC or a device that includes the die (stress in addition to minimizing risk of residual stress in package). Moreover, embodiments of the stress minimization solutions described herein can also assist with removing material constraints that otherwise needed to be followed in order to minimize stress in Si-PICs and Si-PIC packages. Examples of such constraints include a requirement that the stress in Si-PICs and Si-PIC packages be minimized indirectly through: (i) modulating assembly process parameters (e.g., using epoxy cure temperature to reduce residual stress, etc.); or (ii) making design choices that minimize stress in Si-PICs and Si-PIC packages (e.g., using wire bonds to connect a package substrate to an Si-PIC instead of using flip chip interconnect structures, such as bumps, pillars, microbumps, or using underfill compositions, such as epoxy resins, etc.).

FIG. 1 depicts a diagram of a cross-sectional view of an Si-PIC 100 coupled to an optical fiber 118 via a lens 116. The Si-PIC 100 may be a receiver. The Si-PIC 100 may be formed using SIO technology. As a result, the Si-PIC may include an active layer 102, where a device is epitaxially formed on the silicon (Si) layer, an insulator layer 104 formed from a suitable material (e.g., silica, etc.), and a base layer 106 formed from silicon.

As shown, the active layer 102 is on front side 108 of Si-PIC 100. The active layer 102 catches the optical signals or pulses of light in a photodetector and then electrically carries the current through interconnects not shown out the surface of 108 and to the system or package. In some scenarios, the active layer 102 may include one or more electronic connections or may have other discrete electronic devices bonded to this surface (e.g., an electronic IC die, an electronic IC die package, etc.). For one embodiment, the active layer 102 includes one or more of the following: (i) one or more photonic devices; and (ii) one or more electronic interconnects.

One or more photonic devices may be fabricated within or on the active layer 102. Examples of a photonic device used in the receiver shown in FIG. 1 is a photodetector but similarly on a transmitter devices that may be included, but are not limited to, one or more of the following: (i) a laser light source or amplifier formed from group III-V compound semiconductors (e.g., gallium arsenide (GaAs), aluminium gallium arsenide (AlGaAs), indium phosphide (InP), etc.); (ii) an optical modulator (e.g., a Mach-Zehnder interferometer (MZI), electro-absorption modulator (EAM) etc.); (iii) a micro-optical system (e.g., lenses, arrays of lenses, etc.); (iv) a photodetector; (v) an optical switch; and (vi) one or more silicon waveguides used to transport the optical signals to and from the other photonic devices. In addition, the active layer 102 may also include fabricated electronic devices, along with the photonic devices. Examples of electronic devices that may be included in the active layer 102 are transistors, capacitors, resistors, and/or inductors. A standard fabrication process for these photonic and electronic devices is a complementary metal oxide-semiconductor (CMOS) process.

The insulator layer 104 (which is formed from a suitable material (e.g., silica, etc.)) may be disposed between the active layer 102 and the base layer 106. The base layer 106 is on backside 110 of Si-PIC 100. The base layer 106 is a bulk silicon layer that provides support for Si-PIC 100.

An optical fiber connector or lens structure 116 may be used to couple the Si-PIC 100 and an optical fiber 118. A diffractive grating coupler 122 and/or a reflective structure 124 may be used to direct optical signals 120 to and from the active layer 102 to and from the optical fiber 118 or a photodetector directly below the incoming light source may be used to capture the light in its entirety.

Diffractive grating coupler 122 is a lithographically fabricated structure in the active layer 102 that is designed to diffract optical signals to and from one or more photonic devices within the active layer 102. One benefit of using diffractive grating coupler 122 is that diffractive grating coupler 122 may perform a plurality of optical operations simultaneously. Reflective structure 124 is an optical structure located within the front side 108 of the Si-PIC 100. The reflective structure 124 is designed to reflect optical signals 120. The reflective structure 124 may, for example, be a mirror or one or more layers of thin metal film. Also, it should be noted that even though in this example of FIG. 1, a combination of reflective and diffractive structures are used in Si-PIC 100, alternative illustrative embodiments may use only reflective structures or may use only diffractive structures in Si-PIC 100. Similarly the optical path could be in the plane rather than normal to the active layer plane. Only one implementation though is shown for simplicity.

As alluded to above, the active layer 102 transports optical signals 120. These optical signals 120 are diffracted out of plane with the active layer 102 by the diffractive grating coupler 122. The reflective structure 124 reflects the optical signals 120 diffracted toward the front side 108 of the Si-PIC 100. As a result, most, if not all, of the optical signals 120 are directed through the Si-PIC 100. At backside 110 of the base layer 106, the optical signals 120 may be collimated from the diffractive grating coupler 122 and the reflective structure 124. The Si-PIC 100 may be designed to collimate or focus the optical signals 120 to the optical fiber connector 116. The collimated optical signals 120 may comprise a plurality of parallel pulses of light that spread slowly as they propagate. The optical fiber connector 116 is connected to the optical fiber 118.

Even though the illustrated embodiment shown in FIG. 1 is focused on a straight optical fiber connector to optical fiber arrangement above the Si-PIC 100, other optical fiber connector arrangements are possible as is known in the art. Further, the optical signals 120 shown in FIG. 1 originate from an external laser source. For example, and as shown in FIG. 1, the optical signals 120 originate from a laser source that generates the light signals 120 (not shown in FIG. 1) and is coupled to the optical fiber 118. Other embodiments, however, are not so limited. For example, the optical signals 120 may originate directly from a hybrid or heterogeneous integration of a III-V device/material on the Si-PIC 100.

Figure 2:
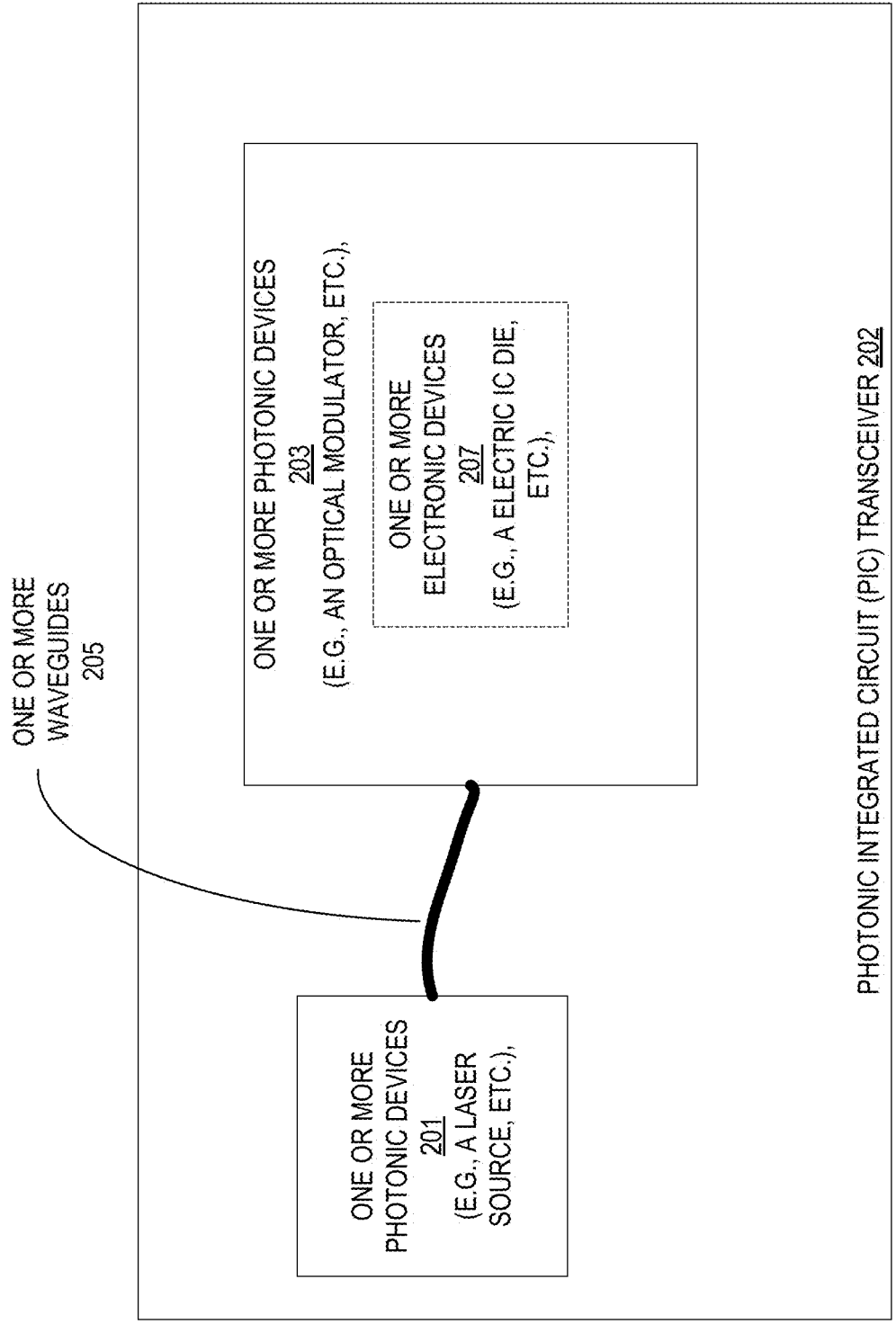
FIG. 2 illustrates a top side view illustration of an Si-PIC transceiver, according to an embodiment.

FIG. 2 illustrates a top side view illustration of an Si-PIC transceiver 202, according to an embodiment. As shown, the Si-PIC transceiver 202 includes one or more first photonic devices 201 that may be grown or bonded to an Si-PIC and one or more second photonic devices 203 that are used to modulate the light. One or more silicon waveguides 205 may be used to transport optical signals to and from the other photonic devices 201 and 203. In some embodiments, the Si-PIC transceiver 202 may include one or more electronic devices 207 fabricated on or bonded to the Si-PIC. In some embodiments, it is advantageous to have the electronic devices or circuitry 207 modulating optical signals directly over or under optical modulators 203. Examples of photonic devices and electronic devices that may be disposed or formed on the Si-PIC transceiver 202 are described above in connection with FIG. 1.

With regard now to FIGS. 3A-3B, which illustrate cross-sectional side view illustrations 300 and 350 showing an Si-PIC package that includes a stress minimization solution, according to one embodiment. The illustration 300 shows the package in an unflexed state (i.e., no stress is applied to the package) and the illustration 350 shows the package in a flexed state (i.e., some stress is applied to the package).

With regard now to FIG. 3A, the illustration 300 shows a semiconductor package includes a package substrate 303 that has at least one three dimensional (3D) etched cavity 301 formed therein. For one embodiment, a stage 311 is created in the package substrate 303 due to the formation of the cavities 301. Furthermore, interconnections 305 (e.g., bumps, microbumps, pillars, underfill compositions, epoxy resin, a combination thereof, etc.) are disposed or formed on the stage 311. One or more Si-PICs 313 are coupled to the stage 311 via the interconnections 305. For one embodiment, one or more components (e.g., electronic devices, electronic IC dies, electronic IC packages, heat spreaders, heat sinks, etc.) that are not sensitive to stress may be formed or disposed on surfaces 325 and 327.

Stress in an Si-PIC package can cause laser performance degradation, which can result from changes in the spacing of the grating in the laser. Generally, the spacing of the grating determines the wavelength of lasers produced. As a result, changes in the spacing can lead to increased production of side mode wavelengths, which can in turn result in failing side mode suppression ratio (i.e., ratio of peak wavelength to side mode wavelength). In addition to this, a refractive index of optical waveguides can also change due to stress, which can degrade the performance of the Si-PIC(s) 313 or a package that include such die(s). Stresses may not be limited to direct mechanical interaction. Stress changes can also be caused by thermal strain, which too results in laser degradation.

For one embodiment, the cavities 301 and the stage 311 assist with mitigating stress affecting photonic and/or electronic devices in the package by decoupling one or more Si-PICs 313 and the interconnects 303 from the package substrate 303. As shown in FIG. 3A, the interconnects 303 may be a potential source of stress.

For one embodiment, the cavities 301 are formed by removing (e.g., etching, drilling, degrading sacrificial material, etc.) material from the package substrate 303 orthogonally to a direction of risk stress 307 (e.g., a direction of laser grating, etc.) associated with the Si-PIC(s) 313. In an embodiment, at least one of the cavities 301 is formed by removing material from the package substrate 303 orthogonally to a direction of risk stress associated with the Si-PIC package or the Si-PIC(s) 313. The direction of risk stress can be a direction of laser grating associated with the Si-PIC(s) 313 or the Si-PIC package. The direction of risk stress can be a direction of laser grating associated with one or more photonic devices of the Si-PIC(s) 313 or the Si-PIC package. In this way, the stress may be orthogonally transferred away from the stress-sensitive Si-PIC(s) 313.

Referring now to FIG. 3B, the illustration 350 shows the same semiconductor package shown in FIG. 3A after stress is applied to the package. As shown, the stress applied to the package is introduced into portions 325 and 327 of the package substrate 303 and causes these portions to flex (i.e., to be strained). However, the stage 311 and the interconnects 303 are not affected by the stress, and as a result, the Si-PIC(s) 313 is not affected by the stress.

Figure 3C:
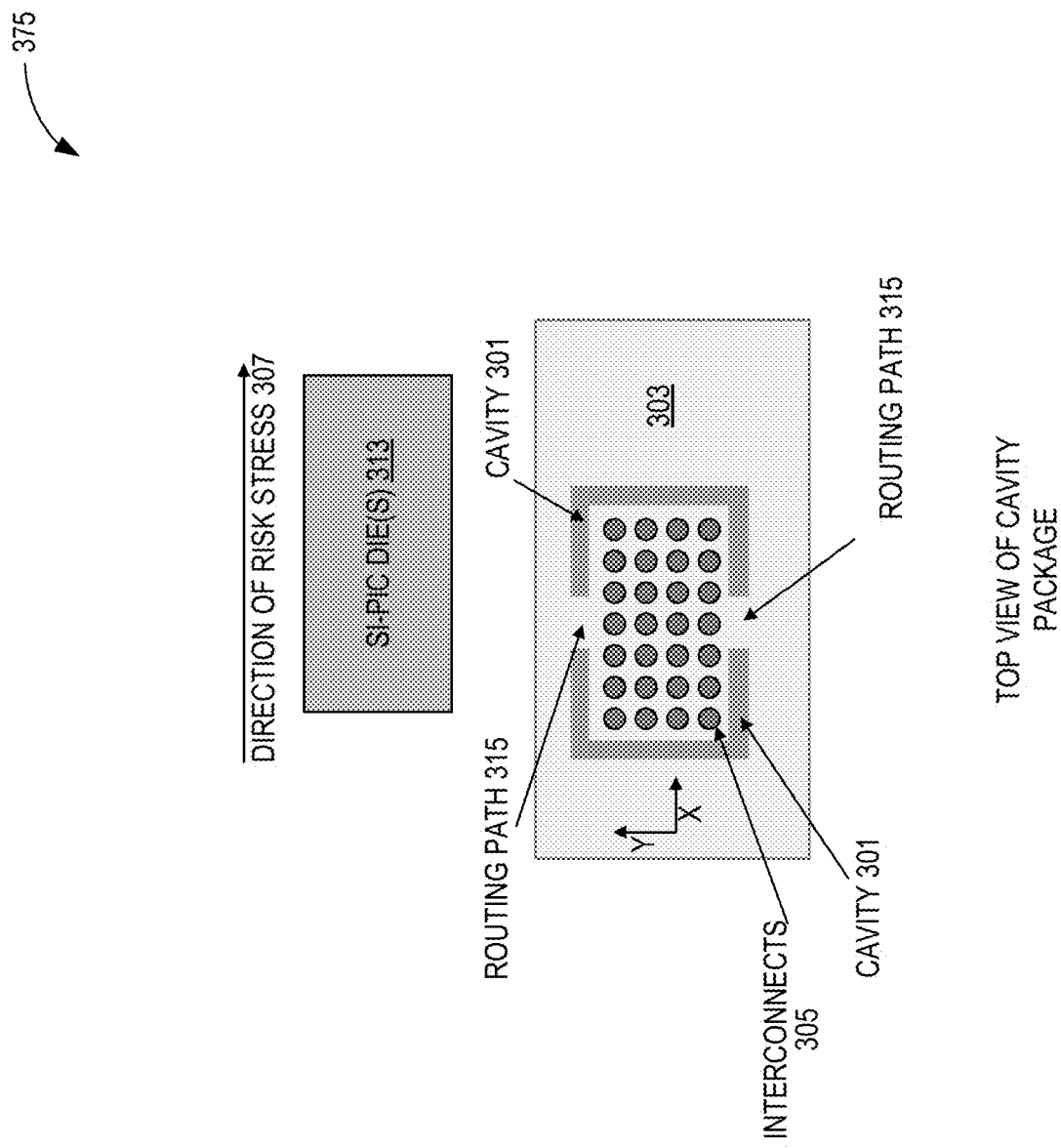
FIG. 3C illustrates a top view illustration of the Si-PIC package illustrated in FIGS. 3A-3B, according to one embodiment.

FIG. 3C illustrates a top view illustration 375 showing the Si-PIC package illustrated in FIGS. 3A-3B, according to one embodiment. As shown, the cavities 301 are separated by routing paths 315. These routing paths 315 form, at least partially, the internal routing circuit of the semiconductor package shown in FIGS. 3A-3C. Even though only two routing paths 315 are shown in FIG. 3C, more or less conductive routing paths 315 can be formed within the semiconductor package shown in FIGS. 3A-3C. For example, there may be one, two, three, or any number of routing paths 315. For one embodiment, at least one of conductive routing paths 315 is physically, optically, and/or electrically coupled with the Si-PICs 313. For one embodiment, at least one of conductive routing paths 315 is physically and/or electrically coupled with the interconnects 305. The routing paths 315 may be formed from copper or any other suitable metal, metal alloy, or materials.

Figure 4A:
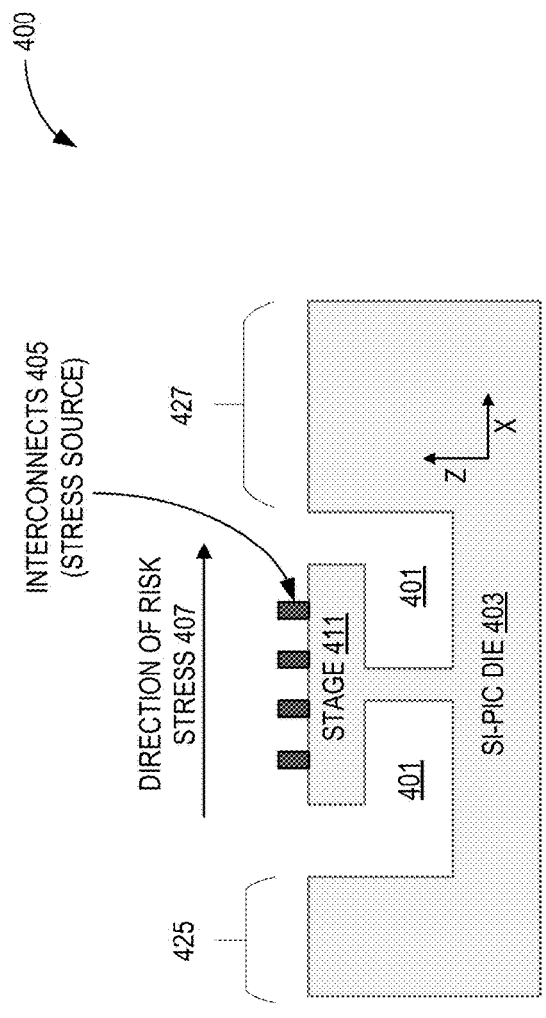
FIGS. 4A-4B illustrate cross-sectional side view and top view illustrations of an Si-PIC that includes a stress minimization solution, according to one embodiment.
Figure 4B:
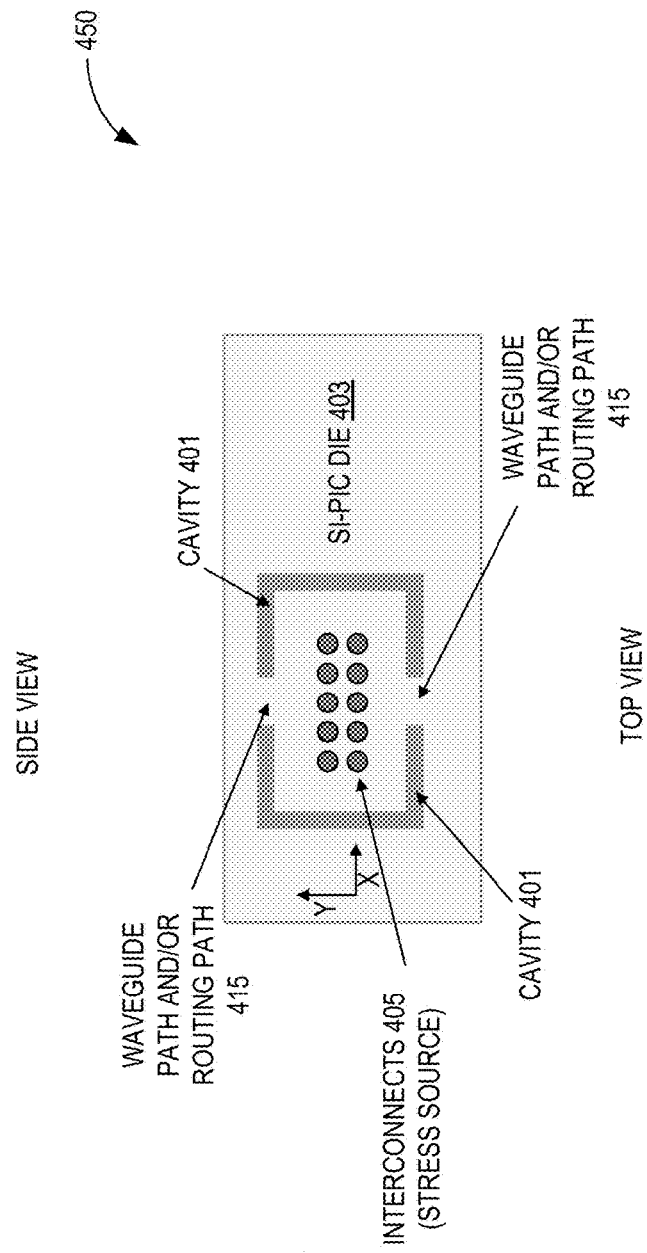

Referring now to FIGS. 4A-4B, which illustrate cross-sectional side view and top view illustrations 400 and 450, respectively, showing an Si-PIC 403 that includes a stress minimization solution, according to another embodiment. The illustrations 400 and 450 show the Si-PIC 403 in an unflexed state (i.e., no stress is applied to the Si-PIC 403). It is to be appreciated that when the Si-PIC 403 is in a flexed state (i.e., some stress is applied to the package), the cavities 401 and the stage 411 assist with minimizing the stress applied to the Si-PIC 403.

Referring now to FIG. 4A, the illustration 400 shows an Si-PIC 403 that includes at least one 3D etched cavity 401 formed therein. For one embodiment, a floating stage 411 is created in the Si-PIC 403 due to the formation of the cavities 401. Furthermore, interconnections 405 (e.g., bumps, microbumps, pillars, underfill compositions, epoxy resin, a combination thereof, etc.) are disposed or formed on the stage 411. The Si-PIC 403 is coupled to a package substrate (not shown) via the interconnections 405.

For one embodiment, one or more photonic and/or electronic devices are formed on one or more portions of an active layer of Si-PIC 403 (e.g., the surface 425, the surface 427, etc.) without forming any photonic and/or electronic devices on one or more other portions of the active layer of Si-PIC 403 (e.g., the stage 411, etc.). That is, one or more portions of the Si-PIC 403 can be used for receiving stress from a stress source, so that one or more other portions of the Si-PIC 403 having photonic and/or electronic devices are protected from the stress. In this way, the cavities 401 and the stage 411 assist with mitigating stress (e.g., stress induced laser degradation, etc.) by decoupling photonic and/or electronic devices formed on the Si-PIC 403 from a source of stress (e.g., the interconnects 405 used for coupling the Si-PCI die 403 to a package substrate, etc.).

For one embodiment, the cavities 401 are formed by removing (e.g., etching, drilling, etc.) material from the Si-PIC 403 orthogonally to a direction of risk stress 407 associated with the Si-PIC 403. The direction of risk stress can be a direction of laser grating associated with the Si-PIC 403 or a direction of laser grating associated with one or more photonic devices of the Si-PIC 403. In this way, the stress may be orthogonally transferred away from the Si-PIC 403.

Referring now to FIG. 4B, which illustrates a top view illustration 450 showing the Si-PIC package 403 illustrated in FIG. 4A, according to one embodiment. As shown, the cavities 401 are separated by routing paths 415 (which may also be referred to as waveguide paths 415). These routing paths 415 form, at least partially, the internal routing circuit of the Si-PIC 403. Even though only two routing paths 415 are shown in FIG. 4B, more or less conductive routing paths 415 can be formed within the Si-PIC 403. For example, there may be one, two, three, or any number of routing paths 415. For one embodiment, at least one of conductive routing paths 415 is physically, optically, and/or electrically coupled with one or more of the photonic and/or electronic devices formed on the Si-PIC 403. For one embodiment, at least one of conductive routing paths 415 is physically and/or electrically coupled with the interconnects 405. The routing paths 415 may be formed from copper or any other suitable metal, metal alloy, or materials. The path(s) 415 may carry optical signals through waveguides to the larger Si-PIC 403. For some embodiments, optical pathways may traverse across the area 415 and suitable materials would include silicon waveguide ribs clad in oxide or any other similar structure known in the art.

Referring now to FIGS. 5A-5B, which illustrate cross-sectional side view and top view illustrations 500 and 550, respectively, showing an Si-PIC 503 that includes a stress minimization solution, according to yet another embodiment. The illustrations 500 and 550 show the Si-PIC 503 in an unflexed state (i.e., no stress is applied to the Si-PIC 503). It is to be appreciated that when the Si-PIC 503 is in a flexed state (i.e., some stress is applied to the package), the cavities 501 and the stage 511 assist with minimizing or eliminating the stress applied to the SI-PIC 503.

Referring now to FIG. 5A, the illustration 500 shows an Si-PIC 503 that includes at least one 3D etched cavity 501 formed therein. For one embodiment, a floating stage 511 is created in the Si-PIC 503 due to the formation of the cavities 501. Furthermore, interconnections 505 (e.g., bumps, microbumps, pillars, underfill compositions, epoxy resin, a combination thereof, etc.) are disposed or formed on a top surface 525 of the Si-PIC 503 that is distinct and separate from the stage 511. The Si-PIC 503 is coupled to a package substrate (not shown) via the interconnections 505.

For one embodiment, one or more photonic and/or electronic devices are formed on one or more portions of an active layer of Si-PIC 503 (e.g., the stage 511, the surface 527, etc.) without forming any photonic and/or electronic devices on one or more other portions of the active layer of Si-PIC 503 (e.g., the surface 525, etc.). That is, one or more portions of the Si-PIC 503 can be used for receiving stress from a stress source, so that one or more other portions of the Si-PIC 503 having photonic and/or electronic devices are protected from the stress, In this way, the cavities 501 and the stage 511 assist with mitigating stress (e.g., stress induced laser degradation, etc.) by decoupling photonic and/or electronic devices formed on the Si-PIC 503 from a source of stress (e.g., the interconnects 505 used for coupling the Si-PCI 503 to a package substrate, etc.).

For one embodiment, the cavities 501 are formed by removing (e.g., etching, drilling, etc.) material from the Si-PIC 503 orthogonally to a direction of risk stress 507 associated with the Si-PIC 503. The direction of risk stress can be a direction of laser grating associated with the Si-PIC 503 or a direction of laser grating associated with one or more photonic devices of the Si-PIC 503. In this way, the stress may be orthogonally transferred away from the Si-PIC 503.

Referring now to FIG. 5B, which illustrates a top view illustration 550 showing the Si-PIC package 503 illustrated in FIG. 5A, according to one embodiment. As shown, the cavities 501 are separated by routing paths 515 (which may also be referred to as waveguide paths 515). These routing paths 515 form, at least partially, the internal routing circuit of the Si-PIC 503. Even though only two routing paths 515 are shown in FIG. 5B, more or less conductive routing paths 515 can be formed within the Si-PIC 503. For example, there may be one, two, three, or any number of routing paths 515. For one embodiment, at least one of conductive routing paths 515 is physically, optically, and/or electrically coupled with one or more of the photonic and/or electronic devices formed on the Si-PIC 503. For one embodiment, at least one of conductive routing paths 515 is physically and/or electrically coupled with the interconnects 505. The routing paths 515 may be formed from copper or any other suitable metal, metal alloy, or materials. The path(s) 515 may carry optical signals through waveguides to the larger Si-PIC 503. For some embodiments, optical pathways may traverse across the area 515 and suitable materials would include silicon waveguide ribs clad in oxide or any other similar structure known in the art.

It is to be appreciated that interconnects may be formed on multiple portions of an Si-PIC or Si-PIC package that includes cavities and a stage. For a first example, and with regard to FIG. 5A, the interconnects 505 may be formed on two or more of the surface 525, the surface 527, and stage 511. For a second example, and with regard to FIG. 4A, the interconnects 405 may be formed on two or more of the surface 425, the surface 427, and stage 411. For a third example, and with regard to FIG. 3A, the interconnects 305 may be formed on two or more of the surface 325, the surface 327, and stage 311.

Figure 6:
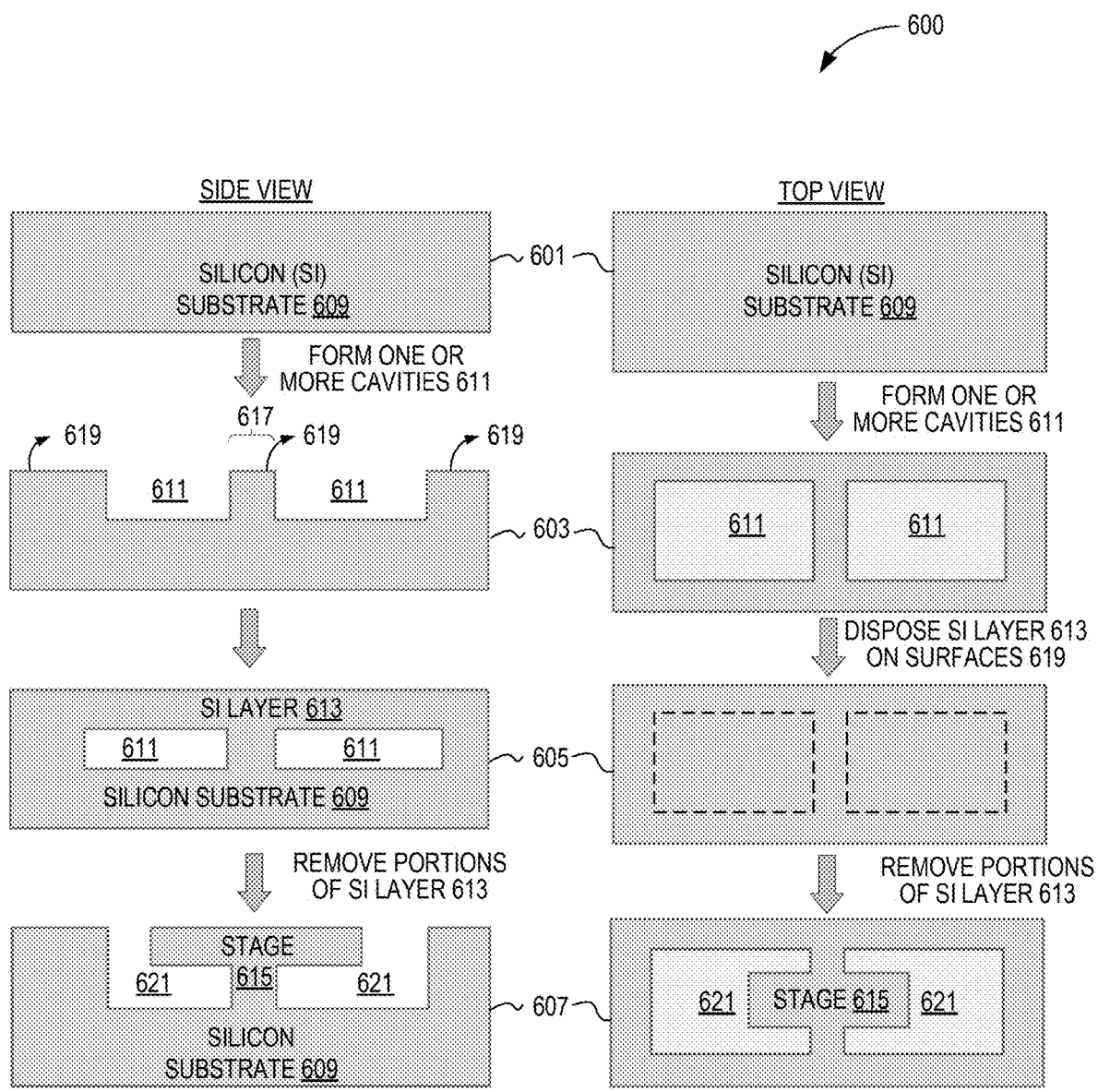
FIG. 6 comprises cross-sectional side and top view illustrations of a method of forming a stress minimization solution in a silicon substrate, according to one embodiment.

FIG. 6 comprises cross-sectional side and top view illustrations of a method 600 of forming a stress minimization solution in a silicon substrate 609 according to one embodiment. The method 600 includes operations 601, 603, 605, and 607.

The method 600 begins at operation 601. Here, a silicon substrate 609 is provided. For one embodiment, the silicon substrate 609 is part of an active layer of an Si-PIC. For another embodiment, the silicon substrate 609 is part of a carrier substrate (e.g., a chip carrier, etc.) that is coupled to an Si-PIC and used to form an Si-PIC package. At operation 603, at least one opening 611 is formed in the silicon substrate 609. For a first example, a plurality of openings 611 are formed in the silicon substrate 609 via any suitable etching techniques (e.g., wet etching techniques, anisotropic wet etching techniques, plasma etching techniques, photolithography techniques, etc.). For a second example, the plurality of openings 611 are formed in the silicon substrate 609 via any other suitable techniques (e.g., laser drilling techniques, etc.). As shown in FIG. 6, the openings 611 are separated by a pillar 617 formed from the silicon substrate 609.

The method 600 proceeds to operation 605, where a silicon layer 613 is disposed on the silicon substrate 609. For one embodiment, the silicon layer 613 is bonded to exposed top surfaces 619 of silicon substrate 609. Bonding techniques include, but are not limited to, direct bonding techniques, fusion bonding techniques, plasma activated bonding techniques, surface activated bonding techniques, ultra high vacuum (UHV) techniques, surface activation by chemical-mechanical polishing (CMP) techniques, and surface treatment techniques used to achieve chemical activation. For another embodiment, the silicon layer 613 may be attached to the exposed top surfaces 619 via any suitable adhesive (e.g., one or more adhesive layers, one or more adhesive inks, one or more adhesive films, one or more adhesive pastes, etc.). The method 600 ends at operation 607, where removing portions of the silicon layer 613 are removed to form a stage 615 and cavities 621. Removing portions of the silicon layer 613 can be performed using any suitable technique (e.g., etching, drilling, etc.). The stage 615 can be similar to or the same as any of the stages described above in connection with FIGS. 1-5B. The cavities 621 can be similar to or the same as any of the cavities described above in connection with FIGS. 1-5B.

Figure 7:
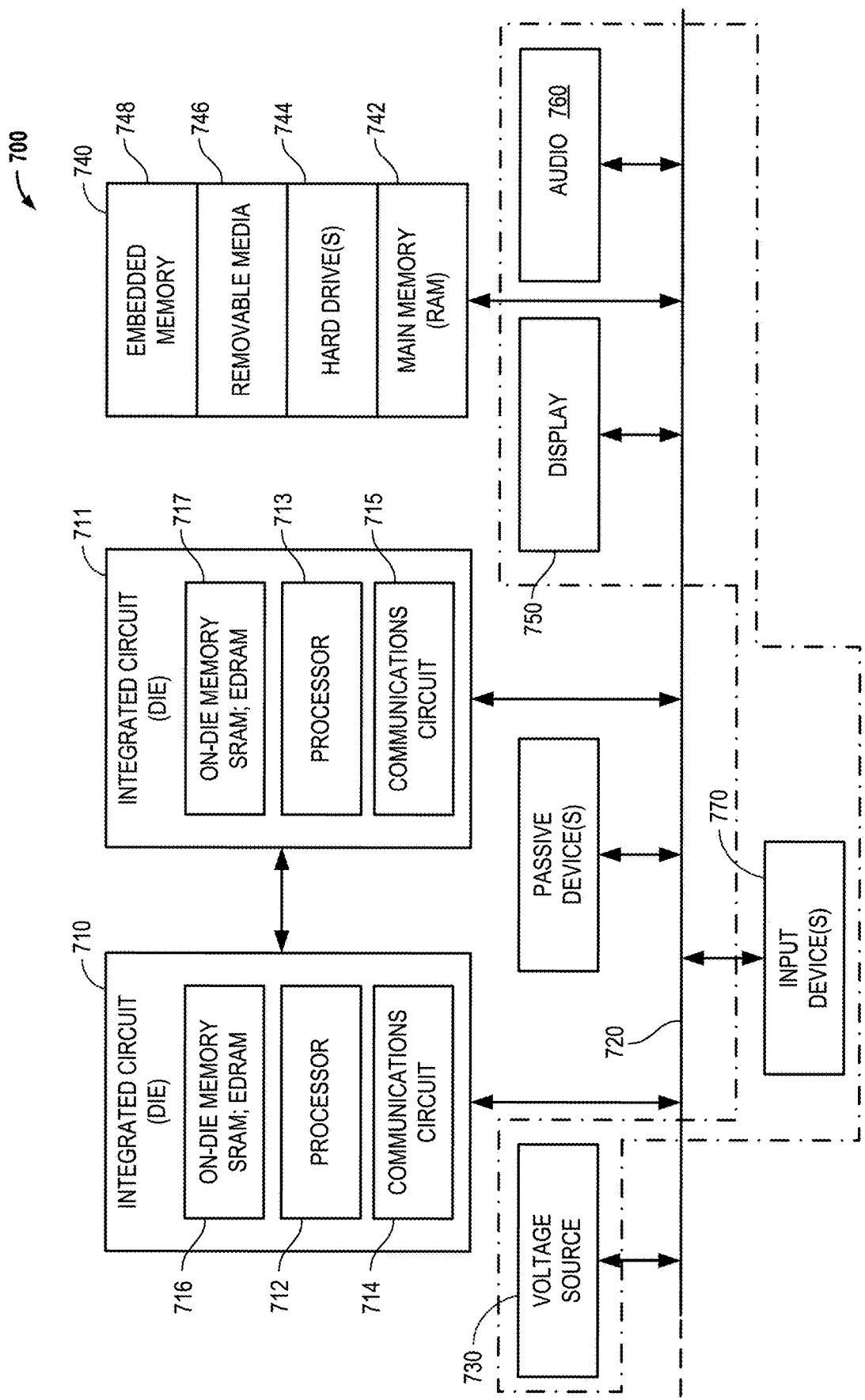
FIG. 7 is an illustration of a schematic block diagram of a computer system that utilizes a semiconductor package, according to one or more embodiments.

FIG. 7 illustrates a schematic of computer system 700 according to an embodiment. The computer system 700 (also referred to as an electronic system 700) can include a semiconductor package (e.g., a semiconductor package comprising an Si-PIC, an Si-PIC package, etc.) in accord with any of the embodiments and their equivalents as set forth in this disclosure. The computer system 700 may be a mobile device, a netbook computer, a wireless smart phone, a desktop computer, a hand-held reader, a server system, a networking system, a supercomputer, or a high-performance computing system.

The electronic system 700 can be a computer system that includes a system bus 720 to electrically couple the various components of the electronic system 700. The system bus 720 is a bus or any combination of busses according to various embodiments. The electronic system 700 includes a voltage source 730 that provides power to the integrated circuit 710. For one embodiment, the voltage source 730 supplies current to the integrated circuit 710 through the system bus 720.

The integrated circuit 710 is electrically coupled to the system bus 720 and includes any circuit, or combination of circuits according to an embodiment. For an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. For an embodiment, the processor 712 includes, or is coupled with, a semiconductor package (e.g., a semiconductor package comprising an Si-PIC, an Si-PIC package, etc.) in accord with any of the embodiments and their equivalents, as described in the foregoing specification. For an embodiment, static random-access memory (SRAM) embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems, or a communications circuit for servers. For an embodiment, the integrated circuit 710 includes on-die memory 716 such as SRAM. For an embodiment, the integrated circuit 710 includes embedded on-die memory 716 such as embedded dynamic random-access memory (eDRAM). For one embodiment, the on-die memory 716 may be packaged with a process that includes one or more embodiments of stress minimization solutions, as described in the foregoing specification.

For an embodiment, the integrated circuit 710 is complemented with a subsequent integrated circuit 711. Useful embodiments include a dual processor 713 and a dual communications circuit 715 and dual on-die memory 717 such as SRAM. For an embodiment, the dual integrated circuit 710 includes embedded on-die memory 717 such as eDRAM.

For an embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such as the first die in a die stack, according to an embodiment.

For an embodiment, the electronic system 700 also includes a display device 750 and an audio output 760. For an embodiment, the electronic system 700 includes an input device such as a controller 770 that may be a keyboard, mouse, trackball, game controller, microphone, voice-recognition device, or any other input device that inputs information into the electronic system 700. For an embodiment, an input device 770 is a camera. For an embodiment, an input device 770 is a digital sound recorder. For an embodiment, an input device 770 is a camera and a digital sound recorder.

At least one of the integrated circuits 710 or 711 can be implemented in a number of different embodiments, including a semiconductor package (e.g., a semiconductor package comprising an Si-PIC, an Si-PIC package, etc.) as described herein, an electronic system, a computer system, one or more methods of fabricating an integrated circuit, and one or more methods of fabricating an electronic assembly that includes a semiconductor package (e.g., an Si-PIC package, etc.), according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the semiconductor package (e.g., a semiconductor package comprising an Si-PIC, an Si-PIC package, etc.) in accordance with any of the several disclosed embodiments as set forth herein and their art-recognized equivalents. A foundation substrate may be included, as represented by the dashed line of FIG. 7. Passive devices may also be included, as is also depicted in FIG. 7.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or Figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semi conductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures.

Embodiments described herein include a semiconductor package, comprising: a silicon photonic integrated circuit (Si-PIC); and a package substrate comprising a plurality of cavities, a stage, and one or more exposed top surfaces, wherein the Si-PIC is on the stage and coupled to the stage via one or more interconnect structures.

Additional embodiments include a semiconductor package, wherein the one or more interconnect structures comprise one or more of bumps, microbumps, pillars, an underfill composition, an epoxy resin, and a combination thereof.

Additional embodiments include a semiconductor package, wherein the package substrate further comprises one or more electronic components formed on the one or more exposed top surfaces of the substrate.

Additional embodiments include a semiconductor package, wherein the Si-PIC comprises one or more of: one or more photonic devices; and one or more electronic devices.

Embodiments described herein include a semiconductor package, comprising: a silicon photonic integrated circuit (Si-PIC); and a package substrate comprising a plurality of cavities, a stage, and an exposed top surface, wherein the Si-PIC is on the stage, wherein an electrical component is on the exposed top surface, and wherein the Si-PIC and the electrical component are coupled to the package substrate via one or more interconnect structures.

Additional embodiments include a semiconductor package, wherein the one or more interconnect structures comprise one or more of bumps, microbumps, pillars, an underfill composition, an epoxy resin, and a combination thereof.

Additional embodiments include a semiconductor package, wherein the package substrate further comprises a second exposed top surface, wherein a second electronic component is on the second exposed top surface and coupled to the package substrate via the one or more interconnect structures.

Additional embodiments include a semiconductor package, wherein the Si-PIC comprises one or more of: one or more photonic devices; and one or more electronic devices.

Embodiments described herein include a silicon photonic integrated circuit (Si-PIC), comprising: one or more exposed top surfaces; a plurality of cavities; and a stage, wherein the stage comprises one or more interconnect structures formed thereon.

Additional embodiments include an Si-PIC, wherein the plurality of cavities and the stage are formed in or on an active silicon layer of the Si-PIC.

Additional embodiments include an Si-PIC, wherein the one or more interconnect structures comprise one or more of bumps, microbumps, pillars, an underfill composition, an epoxy resin, and a combination thereof.

Additional embodiments include an Si-PIC, wherein a package substrate is coupled to the one or more interconnect structures.

Additional embodiments include an Si-PIC, wherein the Si-PIC further comprises one or more of: one or more photonic devices formed on the one or more exposed top surfaces; and one or more electronic devices.

Embodiments described herein include an Si-PIC, comprising: a plurality of cavities; a stage; and one or more exposed top surfaces, wherein one of the one or more exposed top surfaces comprises one or more interconnect structures formed thereon.

Additional embodiments include an Si-PIC, wherein the plurality of cavities and the stage are formed in or on an active silicon layer of the Si-PIC.

Additional embodiments include an Si-PIC, wherein the one or more interconnect structures comprise one or more of bumps, microbumps, pillars, an underfill composition, an epoxy resin, and a combination thereof.

Additional embodiments include an Si-PIC, wherein a package substrate is coupled to the one or more interconnect structures.

Additional embodiments include an Si-PIC, wherein the Si-PIC further comprises one or more of: one or more photonic devices formed on another one of the one or more exposed top surfaces or on the stage; and one or more electronic devices.

Embodiments described herein include a method of forming a semiconductor package, comprising: forming a plurality of cavities, a stage, and one or more exposed top surfaces in a package substrate; and disposing a silicon photonic integrated circuit (Si-PIC) on the stage, the Si-PIC coupled to the stage via one or more interconnect structures.

Additional embodiments include a method, wherein forming the plurality of cavities comprises: forming at least one of the plurality of cavities by removing material from package substrate orthogonally to a direction of risk stress associated with the Si-PIC.

Embodiments described herein include a method of forming a semiconductor package, comprising: forming a plurality of cavities, a stage, and an exposed top surface in a package substrate; disposing a silicon photonic integrated circuit (Si-PIC) on the stage, the Si-PIC coupled to the stage via one or more interconnect structures; and disposing an electrical component on the exposed top surface, the electrical component coupled to the exposed top surface via one or more interconnect structures.

Additional embodiments include a method, wherein forming the plurality of cavities comprises: forming at least one of the plurality of cavities by removing material from the package substrate orthogonally to a direction of risk stress associated with the Si-PIC.

Embodiments described herein include a method of forming a silicon photonic integrated circuit (Si-PIC), comprising: forming one or more exposed top surfaces, a plurality of cavities, and a stage in a silicon substrate; and forming one or more interconnect structures on the stage.

Additional embodiments include a method, wherein forming the plurality of cavities comprises: forming at least one of the plurality of cavities by removing material from the silicon substrate orthogonally to a direction of risk stress associated with the Si-PIC.

Embodiments described herein include a method of forming a silicon photonic integrated circuit (Si-PIC), comprising: forming one or more exposed top surfaces, a plurality of cavities, and a stage in a silicon substrate; and forming one or more interconnect structures on one of the one or more exposed top surfaces.

Additional embodiments include a method, wherein forming the plurality of cavities comprises: forming at least one of the plurality of cavities by removing material from the silicon substrate orthogonally to a direction of risk stress associated with the Si-PIC.

As used herein, "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together.

The terms used in the following claims should not be construed to limit any of the embodiments described in connection with the foregoing specification, abstract, and/or Figures to the specific embodiments set forth in the foregoing specification, abstract, Figures, and/or claims. Rather, the scope of the claims are to be construed in accordance with established doctrines of claim interpretation.

What is claimed is:

1. A semiconductor package, comprising:
   a silicon photonic integrated circuit (Si-PIC); and
   a package substrate comprising one or more cavities, a stage, and one or more exposed top surfaces, wherein a portion of the stage overhangs one or more of the one or more cavities, and wherein the Si-PIC is on the stage and coupled to the stage via one or more interconnect structures.

2. The semiconductor package of claim 1, wherein the one or more interconnect structures comprise one or more of bumps, microbumps, pillars, an underfill composition, an epoxy resin, and a combination thereof.

3. The semiconductor package of claim 1, wherein the package substrate further comprises one or more electronic components positioned on the one or more exposed top surfaces of the substrate.

4. The semiconductor package of claim 1, wherein the Si-PIC comprises one or more of:
   one or more photonic devices; and
   one or more electronic devices.

5. A semiconductor package, comprising:
   a silicon photonic integrated circuit (Si-PIC); and
   a package substrate comprising one or more cavities, a stage, and an exposed top surface, wherein a portion of the stage overhangs one or more of the one or more cavities, wherein the Si-PIC is on the stage, wherein an electrical component is on the exposed top surface, and wherein the Si-PIC and the electrical component are coupled to the package substrate via one or more interconnect structures.

6. The semiconductor package of claim 5, wherein the one or more interconnect structures comprise one or more of bumps, microbumps, pillars, an underfill composition, an epoxy resin, and a combination thereof.

7. The semiconductor package of claim 5, wherein the package substrate further comprises a second exposed top surface, wherein a second electronic component is on the second exposed top surface and coupled to the package substrate via the one or more interconnect structures.

8. The semiconductor package of claim 5, wherein the Si-PIC comprises one or more of:
   one or more photonic devices; and
   one or more electronic devices.

9. A silicon photonic integrated circuit (Si-PIC), comprising:
one or more exposed top surfaces;
one or more cavities; and
a stage, wherein a portion of the stage overhangs one or more of the one or more cavities, and wherein the stage comprises one or more interconnect structures positioned thereon.

10. The Si-PIC of claim 9, wherein the one or more cavities and the stage are positioned in or on an active silicon layer of the Si-PIC.

11. The Si-PIC of claim 9, wherein the one or more interconnect structures comprise one or more of bumps, microbumps, pillars, an underfill composition, an epoxy resin, and a combination thereof.

12. The Si-PIC of claim 11, wherein a package substrate is coupled to the one or more interconnect structures.

13. The Si-PIC of claim 9, wherein the Si-PIC further comprises one or more of:
one or more photonic devices positioned on the one or more exposed top surfaces; and
one or more electronic devices.

14. A silicon photonic integrated circuit (Si-PIC), comprising:
one or more cavities;
a stage, wherein a portion of the stage overhangs one or more of the one or more cavities; and
one or more exposed top surfaces, wherein one of the one or more exposed top surfaces comprises one or more interconnect structures positioned thereon.

15. The Si-PIC of claim 14, wherein the one or more cavities and the stage are positioned in or on an active silicon layer of the Si-PIC.

16. The Si-PIC of claim 14, wherein the one or more interconnect structures comprise one or more of bumps, microbumps, pillars, an underfill composition, an epoxy resin, and a combination thereof.

17. The Si-PIC of claim 16, wherein a package substrate is coupled to the one or more interconnect structures.

18. The Si-PIC of claim 14, wherein the Si-PIC further comprises one or more of:
one or more photonic devices positioned on another one of the one or more exposed top surfaces or on the stage; and
one or more electronic devices.

* * * * *